United States Patent
Sato et al.

(10) Patent No.: US 9,226,423 B2
(45) Date of Patent: Dec. 29, 2015

(54) ELECTRIC CONNECTION BOX

(75) Inventors: Koki Sato, Kakegawa (JP); Takeshi Onoda, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 115 days.

(21) Appl. No.: 13/137,016

(22) Filed: Jul. 15, 2011

(65) Prior Publication Data

US 2012/0024559 A1 Feb. 2, 2012

(30) Foreign Application Priority Data

Aug. 2, 2010 (JP) ................................. 2010-173484

(51) Int. Cl.
*H01R 13/46* (2006.01)
*H05K 7/02* (2006.01)
*B60R 16/023* (2006.01)

(52) U.S. Cl.
CPC ............ *H05K 7/026* (2013.01); *B60R 16/0239* (2013.01)

(58) Field of Classification Search
CPC ......... H02G 3/088; H02G 3/081; H05K 5/06; H05K 7/00; B60R 16/0239; H01R 9/24; H01R 13/52; H01R 13/5213
USPC ........... 174/50, 520, 535, 541, 559, 560, 561, 174/58, 50.5–50.54, 564; 439/76.1, 76.2; 220/3.2, 4.02
See application file for complete search history.

(56) References Cited

U.S. PATENT DOCUMENTS

| | | | |
|---|---|---|---|
| 5,897,392 A * | 4/1999 | Takahashi | B60R 16/0215 429/121 |
| 7,369,381 B2 * | 5/2008 | Tsukamoto et al. | 174/72 A |
| 7,507,905 B2 * | 3/2009 | Kanamaru et al. | 174/50 |
| 7,586,038 B2 * | 9/2009 | Kanamaru et al. | 174/50 |
| 2007/0249189 A1 | 10/2007 | Kaneko et al. | |
| 2008/0105450 A1 * | 5/2008 | Ooi | H01R 13/447 174/50.5 |
| 2008/0139018 A1 * | 6/2008 | Egawa | H01R 11/12 439/76.2 |
| 2008/0149385 A1 | 6/2008 | Kanamaru et al. | |
| 2008/0149386 A1 | 6/2008 | Kanamaru et al. | |

FOREIGN PATENT DOCUMENTS

| | | |
|---|---|---|
| JP | 2006-333576 A | 12/2006 |
| JP | 2007-312494 A | 11/2007 |
| JP | 2010-041808 A | 2/2010 |

OTHER PUBLICATIONS

Office Action issued Sep. 12, 2013 in Chinese Application No. 201110218943.8.

(Continued)

*Primary Examiner* — Jenny L Wagner
*Assistant Examiner* — Pete Lee
(74) *Attorney, Agent, or Firm* — Locke Lord LLP

(57) ABSTRACT

For an object of providing an electric connection box which can maintain waterproof when a car is washed by high-pressure water, the electric connection box includes a box main body having a groove recessed from an outer wall and extending straight; and a side cover slid along a lengthwise direction of the groove so as to be mounted at the box main body, and covering the groove when the side cover is mounted at the box main body. The side cover includes third and fourth plate members to be arranged within a same geometrical plane of the outer wall. The third and fourth plate members are provided with flaps projecting from the third and fourth plate members along a widthwise direction of the groove.

2 Claims, 7 Drawing Sheets

(56) References Cited

OTHER PUBLICATIONS

European Search Report issued Jan. 21, 2014 in connection with European Application No. 1117628.1-1803/2415642.

Office Action dated May 7, 2014 in connection with Japanese Application No. 2010-173484, with English translation.
Office Action issued Mar. 18, 2014 in connection with Chinese Application No. 201110218943.8.

* cited by examiner

ELECTRIC CONNECTION BOX

The priority application Number Japan Patent Application 2010-173484 upon which this patent application is based is hereby incorporated by reference.

TECHNICAL FIELD

This invention relates to an electric connection box to be mounted at an engine room of a car.

BACKGROUND ART

In a vehicle as a mobile body, various electronic apparatuses are generally mounted. For supplying electric power to the various electronic apparatuses, an electric connection box structured integrally with electric components such a connector, a relay, a fuse and the like is provided suitably at a suitable position between the electronic apparatuses and an electric power source in the vehicle.

The electric connection box can be named a junction box, a fuse block, or a relay box. The junction box, the fuse block and the relay box are called by the electric connection box as a generic name, hereafter.

FIG. 9 is a partial perspective view of a general electric connection box. FIG. 10 is a cross-sectional view taken along the line V-V shown in FIG. 9. A general electric connection box 101 includes a box main body made of synthetic resin, which box main body structures an outer shell of the electric connection box; a cassette block 106 made of synthetic resin, in which a plurality of electric components, such relays and fuses, are mounted and which cassette block 106 is arranged in the box main body 102; and a side cover 107.

The box main body 102 is formed into a box shape by a plurality of outer walls. The box main body 102 includes a groove 104 recessed from the outer wall and extending straight. The groove 104 receives electric wires joined with the electric components and connected with a electric power source such as a battery.

The side cover 107 is slid along a lengthwise direction of the groove 104 and mounted at the box main body 102. When the side cover 107 is mounted at the box main body 102, the side cover 107 covers the groove 104 (see Patent document 1).

CITATION LIST

Patent Document 1: Japan Patent Publication Application No. 2010-414808

SUMMARY OF INVENTION

Objects to be Solved

The engine room at which the general electric connection box 101 is mounted, may washed by spraying pressured water of 8-12 Mpa (high pressure water washing). When the electric connection box 101 is washed by high pressured water, the pressured water may flow along the lengthwise direction of the groove 104 and penetrates through a gap formed straight between the groove 104 and the side cover 107 into the box main body 102.

For solving the above problem, an object of the present invention is to provide an electric connection box which can have waterproof performance even if a car is washed by high pressured water.

How to Attain the Object of the Present Invention

In order to overcome the above problems and attain the object, the present invention is to provide an electric connection box including a box main body having a groove recessed at an outer wall and extending straight, a side cover sliding along a lengthwise direction of the groove so as to be mounded at the box main body and covering the groove when the side cover is mounted at the box main body, and the side cover is provided with a plate member formed within a same geometric plane of the outer wall, and the plate member is provided with a flap projecting from the plate member along a widthwise direction of the groove.

According to the present invention, the side cover further includes a pair of parallel members projecting along the widthwise direction of the groove so as to be arranged at an interval to each other, and a connecting member connecting the pair of parallel members; and an insertion wall penetrating between the pair of parallel members so as to be positioned at a position corresponding to the connecting member.

According to the present invention, the box main body further includes a projection projecting toward the outside of the box main body from the insertion wall, and the projection is arranged at a position corresponding to an edge face of one of the pair of parallel members, which one is positioned at a more outer side than the other one.

Effects of the Invention

According to the present invention, the electric connection box includes the box main body having the groove recessed at the outer wall and extending straight, the side cover sliding along the lengthwise direction of the groove so as to be mounded at the box main body and covering the groove when the side cover is mounted at the box main body, and the side cover is provided with the plate member formed within the same geometric plane of the outer wall, and the plate member is provided with the flap projecting from the plate member along the widthwise direction of the groove, so that when the car is washed by the high pressured water, the flap obstructs liquid like water flowing up along the lengthwise direction of the groove through the gap between the side cover and the groove and prevents that the water penetrates into the box main body. Therefore, the electric connection box having waterproof performance when the car is washed by high pressured water can be provided.

According to the present invention, the side cover further includes the pair of parallel members projecting along the widthwise direction of the groove so as to be arranged at the interval to each other, and the connecting member connecting the pair of parallel members; and the insertion wall penetrating between the pair of parallel members so as to be positioned at the position corresponding to the connecting member, so that when the car is washed by the high pressured water, the pressured water may firstly hit (strikes) the insertion wall, and energy of the water is decreased by striking the insertion wall; and the water after that strikes the connecting member and energy of the water is decreased by striking the connecting member; and the water after that strikes the other one of the pair of parallel members which is positioned at a more inner side than the one of the pair of parallel members, and energy of the water is decreased by striking the other one. Thus, energy of the water is decreased (eliminated) and it is prevented that the water penetrates into the box main body, so that the waterproof performance can be more improved.

According to the present invention, the box main body further includes a projection projecting toward the outside of the box main body from the insertion wall, and the projection is arranged at a position corresponding to an edge face of one of the pair of parallel members, which one is positioned at an outer side more than the other one, so that the projection covers the gap between the penetration wall and the one of the pair of parallel members. Thereby, it can be prevented that liquid like water penetrates into the box main body, so that the waterproof performance can be further more improved.

DESCRIPTION OF EMBODIMENTS

Figure 1:
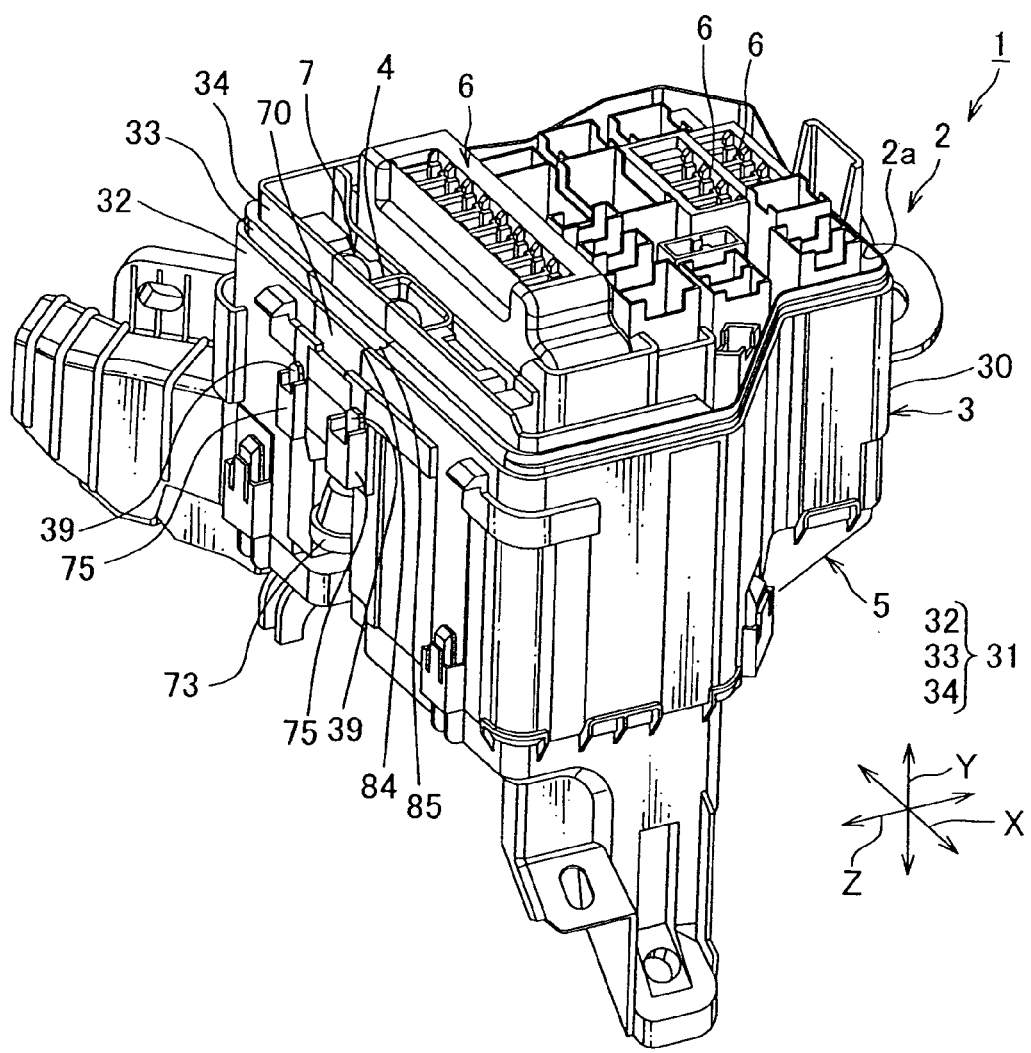
FIG. 1 is a perspective view of an electric connection box of an embodiment according to the present invention.

An electric connection box as an embodiment according to the present invention is described with reference to drawings FIGS. 1-8. The electric connection box 1 shown in FIG. 1 is arranged in an engine room of a car for supplying electric power to various apparatuses mounted at the car. In the specification, a junction box, a fuse block and a relay box are called by the electric connection box as a generic name, hereafter.

The electric connection box 1 as shown in FIG. 1 includes a box main body 2 made of synthetic resin and structuring a shell of the electric connection box 1, a cassette block 6 in which a plurality of electric components such as a relay and a fuse is provided, and being made of synthetic resin and being mounted in the box main body 2, and a side cover 7.

The box main body 2 includes a main body 3 formed into a frame shape by a plurality of outer walls 30, 31, an upper cover (not shown) formed into a pipe shape with a bottom plate and mounted at the main body 3 so as to cover an top surface 2a of the main body 3 for covering the electric components, and a lower cover 5 formed into a pipe shape with a bottom plate and being mounted at a bottom surface (side farther from the top surface 2a) of the main body 3. The electric connection box 1 shown in FIG. 1 is in a condition that the upper cover is removed.

Figure 2:
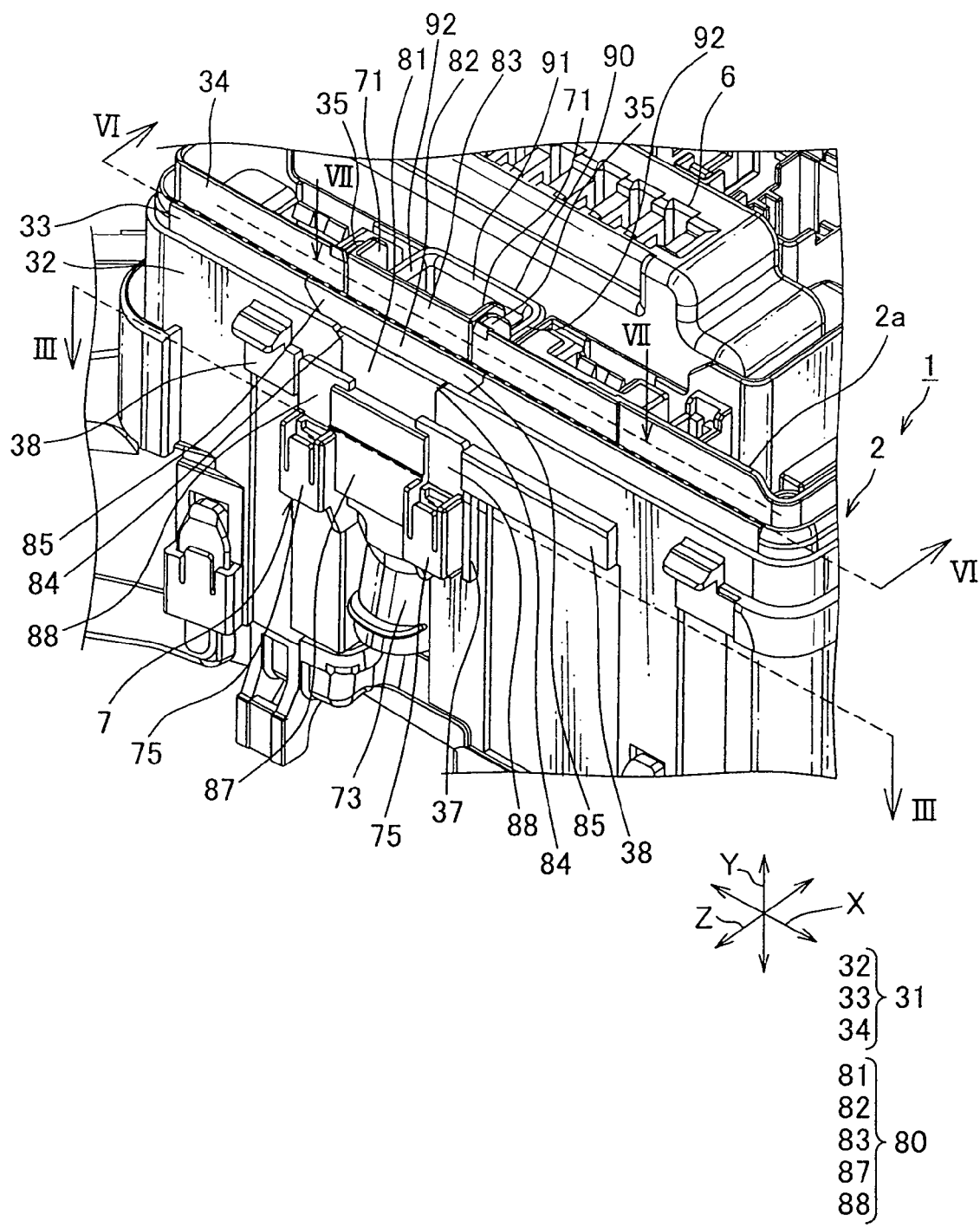
FIG. 2 is a partial perspective view of the electric connection box shown in FIG. 1.

The main body 3 is formed with insulation synthetic resin by injection molding. The main body 3 includes a plurality of outer walls 30, 31, groove 4 arranged at the outer wall 31, and a pair of lock receiving members 39 to be locked respectively with a pair of later-described lock members 75 of the side cover 7, as shown in FIGS. 1, 2. An arrow Y shown in FIG. 1 indicates a direction, in which the cover 5 approaches toward the main body 3, and a lengthwise direction of the groove 4 and the side cover 7. An arrow X indicates a widthwise direction of the groove 4 and the side cover 7. An arrow Z indicates a depth direction of the groove 4.

The outer wall 31 includes a base wall 32, a middle wall 33 overlapped on an inside of the base wall 32, and an inner wall 34 overlapped on an inside of the middle wall 33 as shown in FIGS. 1, 2. As shown in FIG. 2, the end face, at an upper side in a direction by arrow Y, of the middle wall 33 projects from the base wall 32 (that is, exposed). The end face, at the upper side in the direction by arrow Y, of the inner wall 34 projects from the middle wall 33 (that is, exposed). The upper cover is overlapped on the end face (exposed portion), at the upper side in the direction by arrow Y, of the middle wall 33. Thus, at the outer wall 31, a step portion is formed by a plurality of walls 32, 33 and 34.

Figure 3:
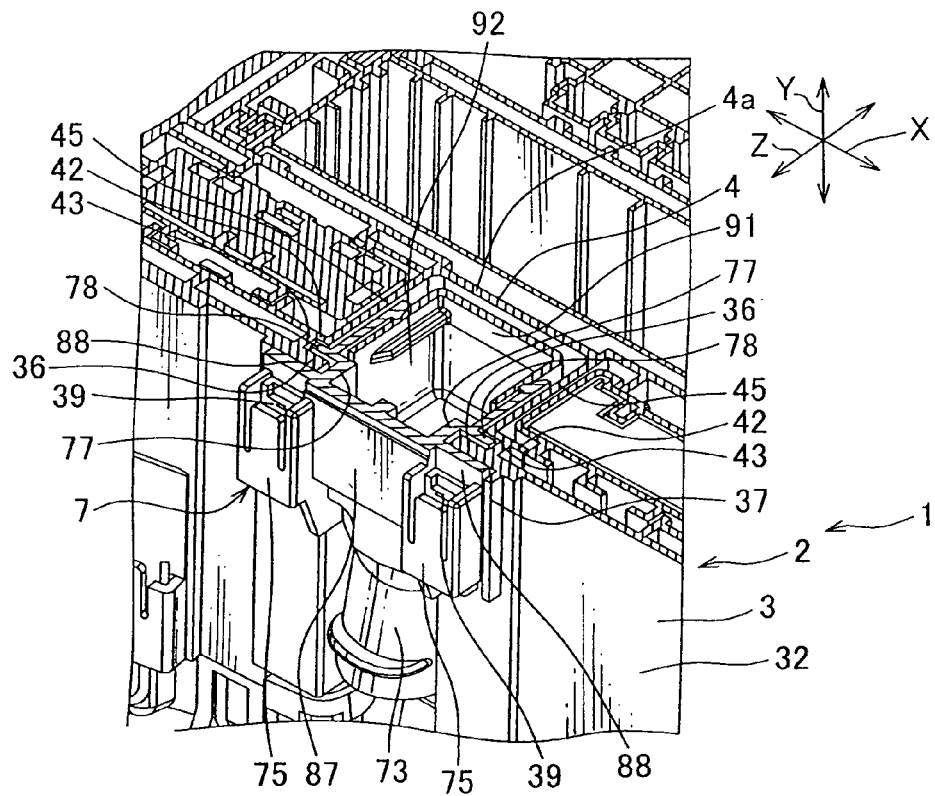
FIG. 3 is a perspective view showing a cross-section taken along the line III-III shown in FIG. 2.

As shown in FIGS. 2, 3, the base wall 32 includes an insertion wall 36, which is arranged at the side cover 7, penetrating between a pair of later-described deep-side parallel plate 78 and the second plate member 88 arranged at the both side edges, closer to the groove 4, of the base wall 32; and a first and second projections 37, 38 arranged at the insertion wall 36.

As shown in FIGS. 2, 3, the first and second projections 37, 38 are arranged at the pair of insertion walls 36. The projections 37, 38 are formed so as to project from an outer surface of the insertion wall 36. In other words, the projections 37, 38 are formed projecting outwardly. The first and second projections 37, 38 are arranged at a position corresponding to an end surface of the later-described second plate member 88 so as to be close to the second plate member 88 provided at the side cover 7. The first projection 37 is arranged only at one insertion wall 36 of the pair of insertion walls 36. The first projection 37 is formed along a lengthwise direction (direction by arrow Y) of the groove 4. The pair of second projections 38 is arranged so as to position the pair of later-described second plate members 88 of the side cover 7 between the pair of second projections 38. Each of the second projections 38 is formed along a widthwise direction (direction by arrow X) of the groove 4. One second projection 38 of the pair of second projections 38 is continued to an end edge, at the upper side in the direction by arrow Y, of the first projection 37. The above first projection 37 and the second projections 38 correspond to "projection" in claims.

As shown in FIGS. 2, 3, the groove 4 is recessed from an outer surface of the outer wall 31, that is the plurality of walls 32, 33, 34, so as to be formed into u-shape by a bottom wall 4a arranged in parallel to the walls 32, 33, 34 at a deeper side than the wall 32, 33, 34, and a pair of side walls 4b extending vertically from the bottom wall 4a to connect the bottom wall 4a and the walls 32, 33, 34. The groove 4 extends straight along a direction from the top surface 2a toward the bottom surface (direction by arrow Y). Electric wires joined with a plurality of electric components, such a fuse and a relay, and connected to an electric power source, such a battery, are received in the groove 4.

Figure 4:
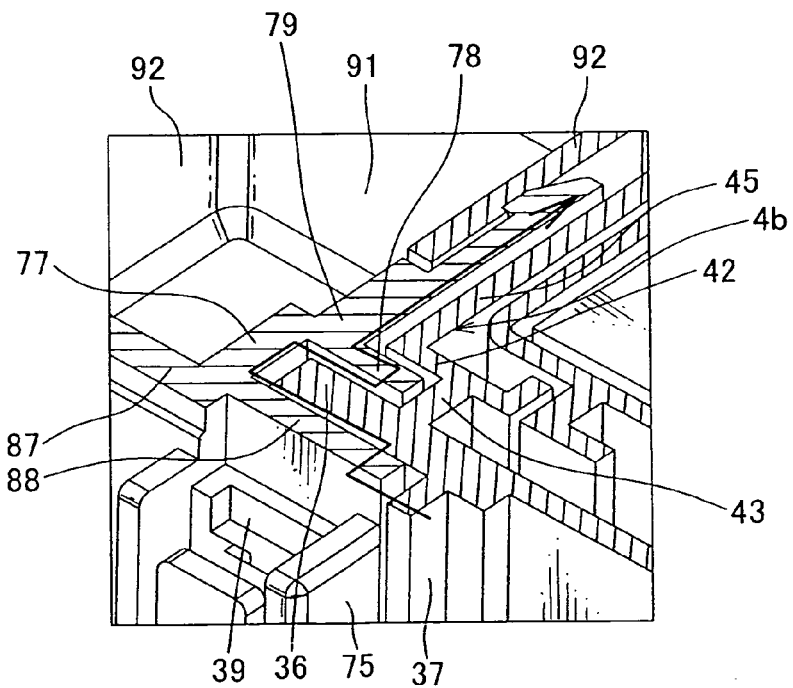
FIG. 4 is a perspective view showing expanded important area shown in FIG. 3.

As shown in FIGS. 3, 4, the side wall 4b includes a first wall 43 extending vertically from the insertion wall 36 (base wall 32) toward a deeper side; a second wall 45 arranged in parallel to the first wall 43 at a more inner side than the first wall 43; a connecting wall 42, parallel to the insertion wall 36, connecting the walls 43 and 45; and a vertical wall 35 (shown in FIG. 2) extending vertically from an edge, close to the groove 4, of the inner wall 34 toward the deeper side.

The connecting wall 42 is arranged at an interval from the insertion wall 36. Between the walls 36 and 42, the deeper-side parallel plate member 78 as the other of later-described parallel portions of the side cover 7 penetrates.

The pair of lock receiving members 39 is arranged so as to position the groove 4 therebetween along the direction by arrow X. The pair of lock receiving members 39 is arranged in a central area of the main body 3 in the direction by arrow Y.

As shown in FIG. 2, the cassette block 6 is formed as a whole into a block shape and each electric component is mounted therein. The cassette block is received in the main body 3 so as to direct the electric components, such as the mounted relay and fuse, to be located at the upper side in the direction by arrow Y of the main body 3.

The other end of the electric wire, one end of which is connected with each one of the various electric components, is led through the side cover 7 to the outside of the box main body 2. The side cove 7 is continued between the inside and the outside of the box main body 2. The side cover 7 is formed into a rectangular shape in plan view similar as a shape in plan view of the groove 4. When the side cover 7 is mounted at the box main body 2, the side cover 7 covers the groove 4 so as to be continued to the walls 32, 33, 34 within the same geometric plane of the outer surfaces of the walls 32, 33, 34.

The side cover 7 is made of insulation synthetic resin by known injection molding. The side cover 7 includes a first member 7A and a second member 7B assembled on the first member 7A so as to be overlapped on the inner surface of the groove 4 (inner surfaces of the walls 4a, 4b). Thus, the side cover 7 is designed to be separable to the first member 7A and the second member 7B, and to be buildable thereby.

Figure 5:
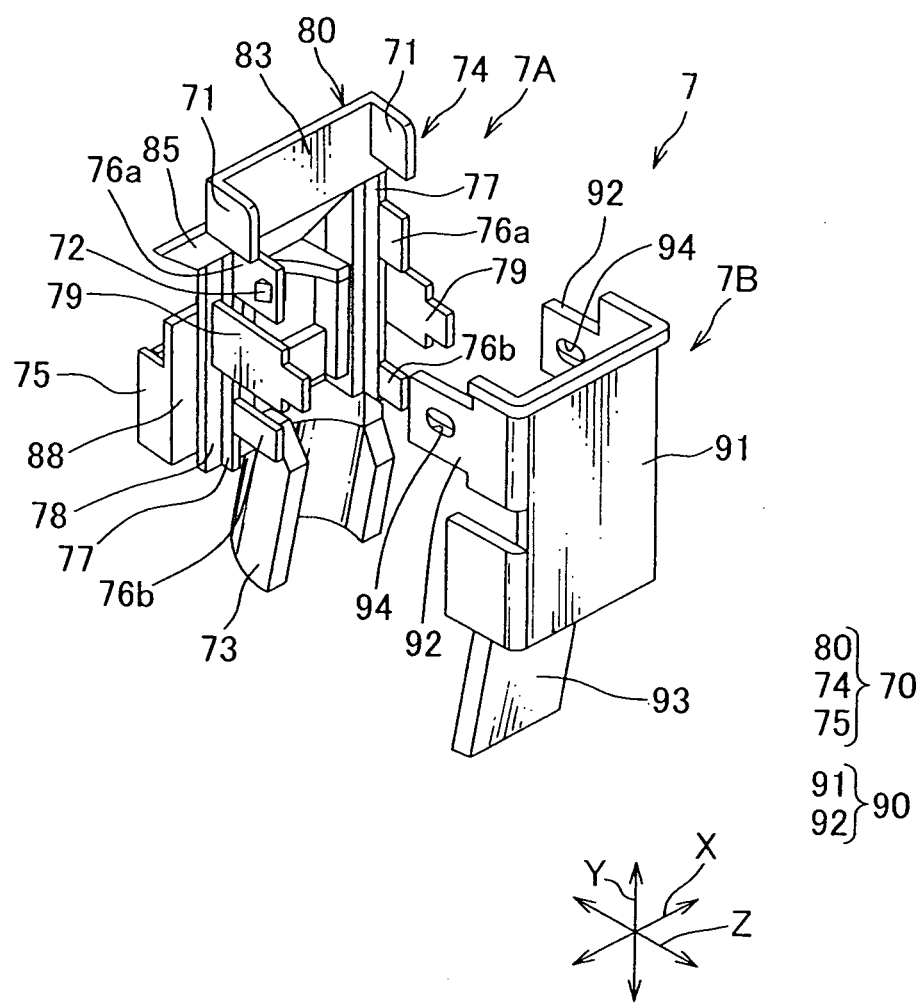
FIG. 5 is a perspective view of a side cover structuring the electric connection box shown in FIG. 1.

As shown in FIG. 5, the first member 7A includes integrally a first insert protect member 70 and a first wire passing section 73.

The first insert protect member 70, as shown in FIG. 5, includes a first plate 80 arranged at a position corresponding to the bottom wall 4a of the groove 4, a pair of first side plates 74 continued to the first plate 80 and arranged at a position corresponding to the side walls 4b of the groove 4, and the pair of lock members 75 locking with each of the lock receiving members 39 of the main body 3.

The first plate 80, as shown in FIG. 2, includes first-fifth plate members 81, 82, 83, 87, 88. The first plate 80 is formed to have a length along the lengthwise direction (direction by arrow Y) longer than a length of a later-described second plate portion 91 of the second member 7B. When the second member 7B is assembled with the first member 7A, the first plate 80 projects from the later-described second plate portion 91 of the second member 7B, as shown in FIG. 2.

When the side cover 7 is mounted at the main body 3 (box main body 2), the first plate member 87 is positioned between the pair of lock receiving members 39 of the main body 3.

As shown in FIGS. 3, 4, a pair of second plate members 88 is arranged in parallel to the first plate member 87 so as to place the first plate member 87 therebetween (in the direction by arrow X). An outer surface of the second plate member 88 is located at a deeper side than the first plate member 87 and also than the projections 37, 38. The second plate member 88 corresponds to "one of parallel members" described in claims.

Figure 7:
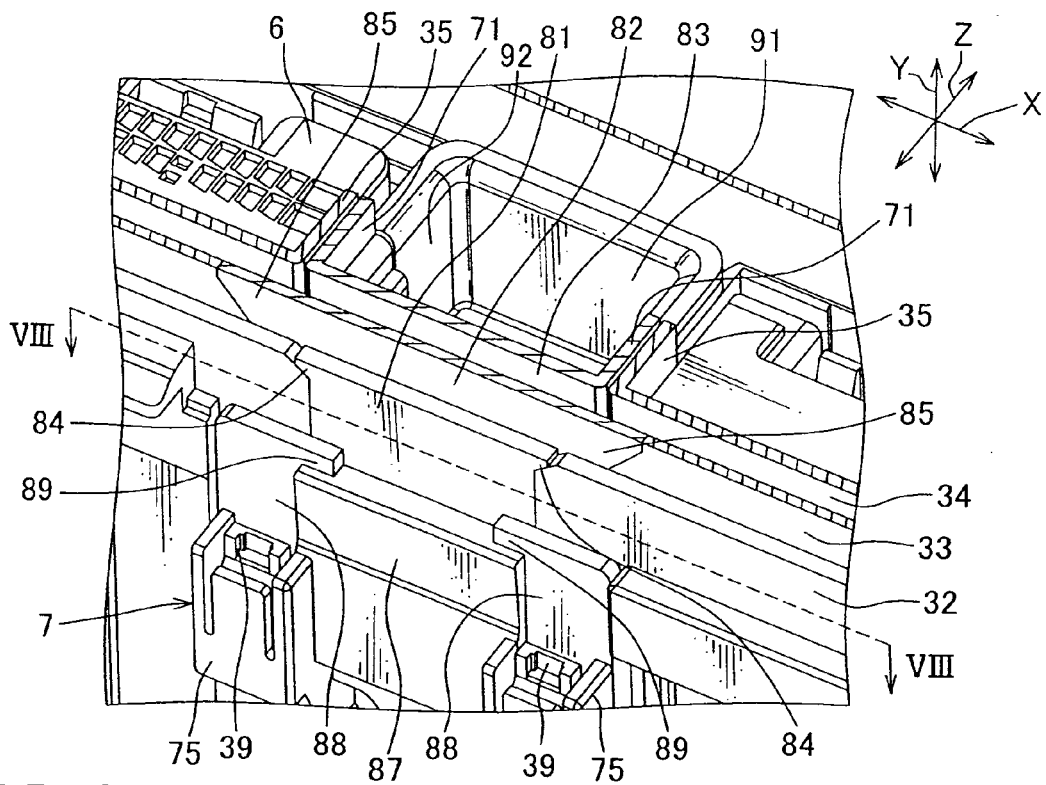
FIG. 7 is a perspective view showing a cross-section taken along the line VII-VII shown in FIG. 2.
Figure 8:
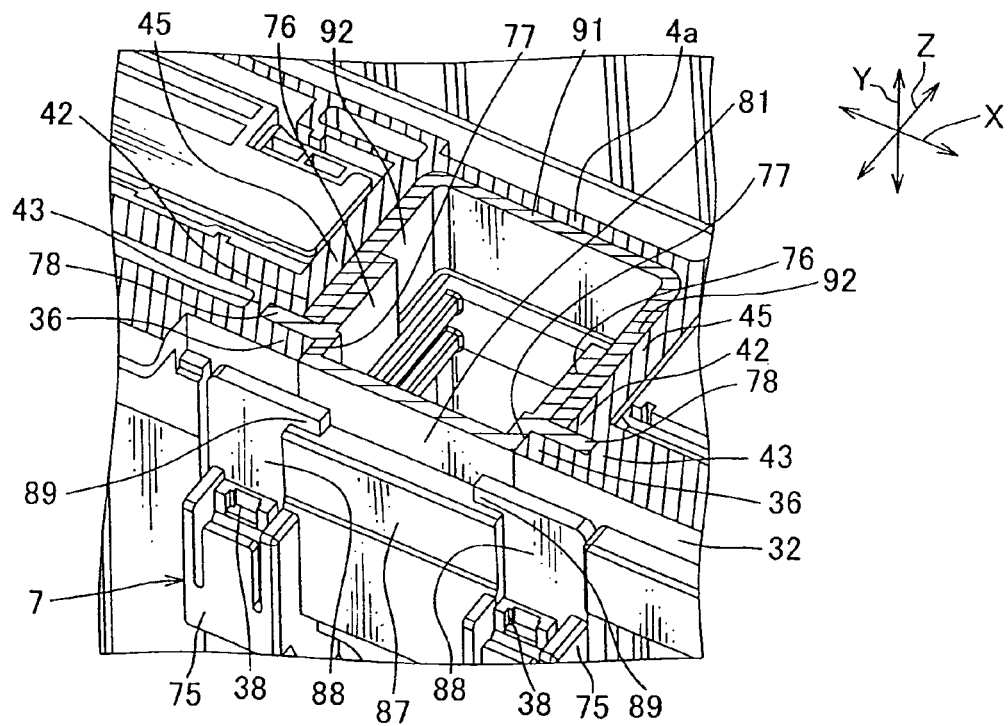
FIG. 8 is a perspective view showing a cross-section taken along the line VIII-VIII shown in FIG. 7.
Figure 9:
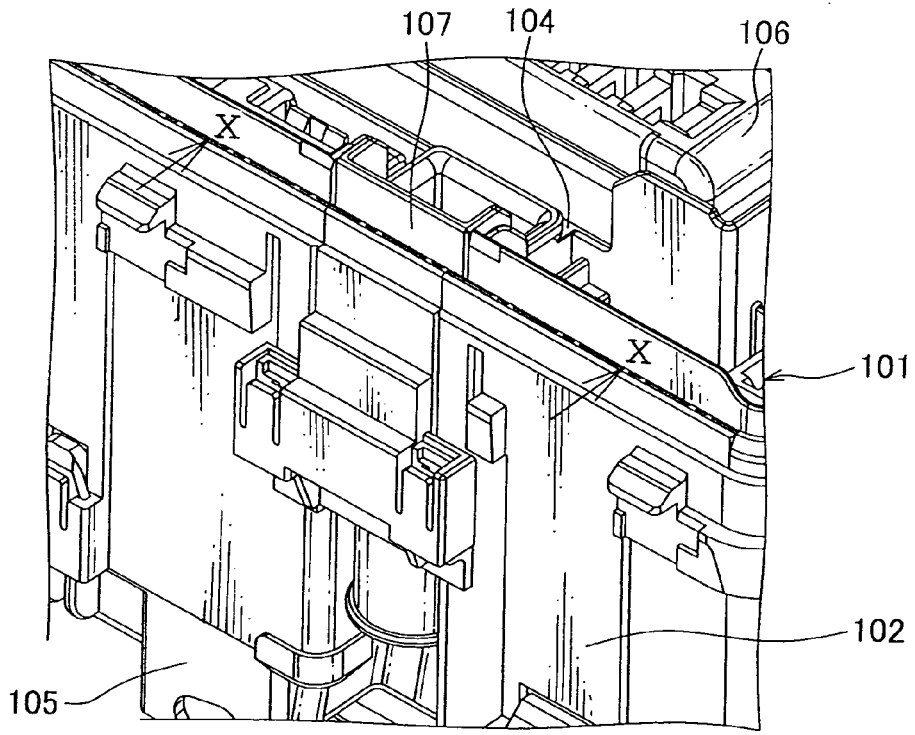
FIG. 9 is a perspective view showing a partial area of a general electric connection box.
Figure 10:
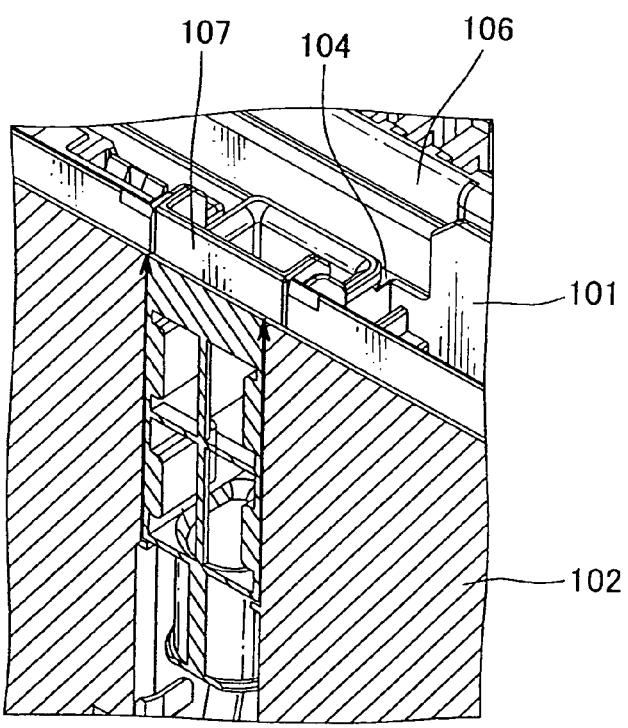
FIG. 10 is a perspective view showing a cross-section taken along the line X-X shown in FIG. 9.

As shown in FIGS. 7, 8, the pair of second plate members 88 includes a pair of hock members 89 projecting from an end portion, at the upper side in the direction by arrow Y, of the second plate member 88 so as to approach each other (in the direction by arrow X). The hock members 89 are overlapped on a surface, at the upper side in the direction by arrow Y, of the first plate member 87.

As shown in FIG. 7, the third plate member 81 is continued to the end, at the upper side in the direction by arrow Y, of the first plate member 87 so as to be within the same geometric plane of the base wall 32. The third plate member 81 includes a pair of flaps 84 arranged at an end at the upper side in the direction by arrow Y of the third plate member 81 and projecting from the third plate member 81 along the widthwise direction of the groove 4 (direction by arrow X). That is, the pair of flaps 84 extends along the widthwise direction (direction by arrow X) so as to be separated to each other. Thus, the third plate member 81 is provided with the flaps 84 projecting from the third plate member 81 along the widthwise direction thereof (direction by arrow X), so that a length of the side cover 7, in which the flaps 84 are arranged, along the widthwise direction (direction by arrow X) is larger (longer) than that of the third plate member 81, in which the flaps are not arranged. The third plate member 81 corresponds to "plate member" described in claims.

Figure 6:
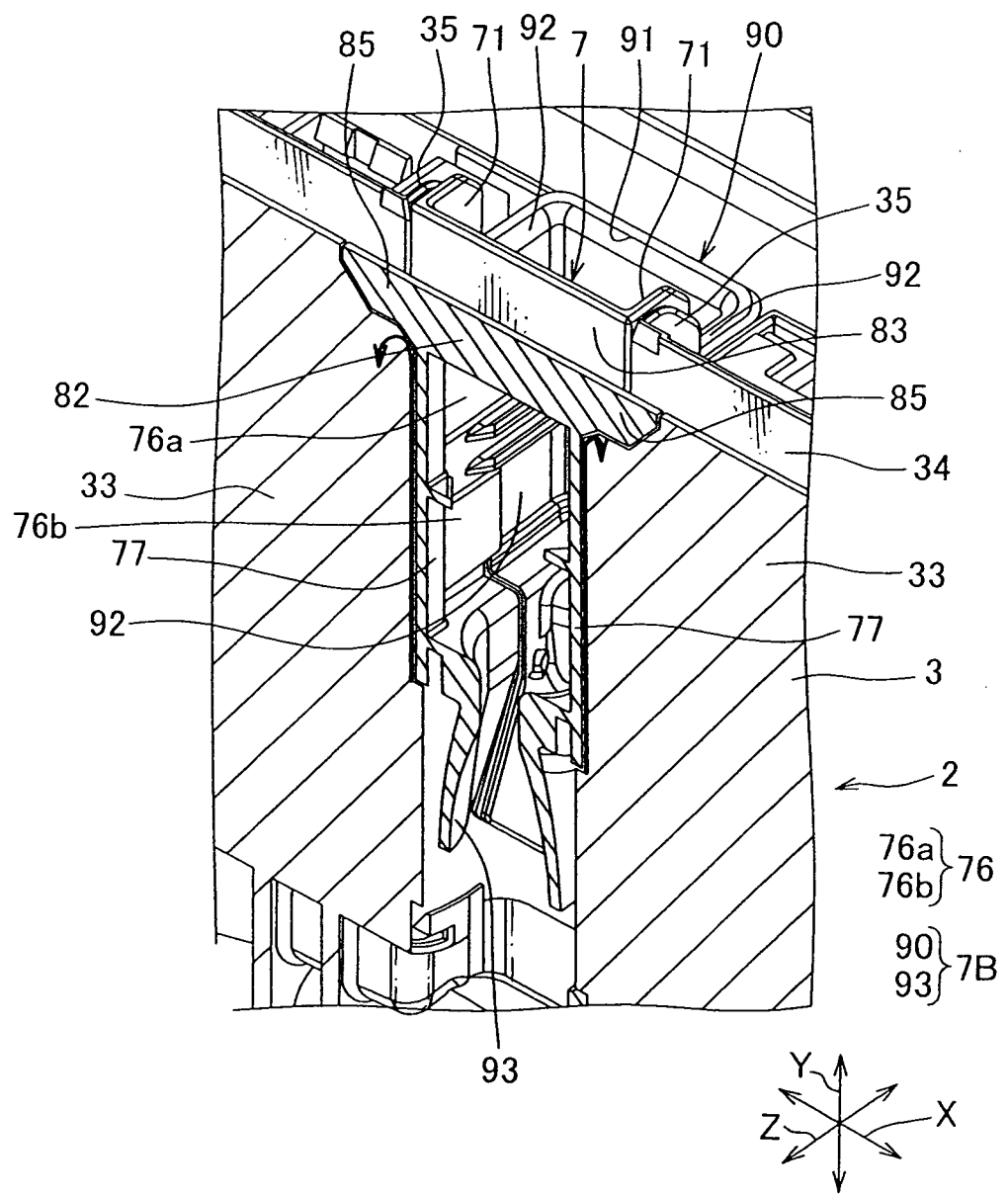
FIG. 6 is a perspective view showing a cross-section taken along the line VI-VI shown in FIG. 2.

As shown in FIGS. 6, 7, the fourth plate member 82 is continued to an area, at the upper side in the direction by arrow Y, of the third plate member 81 so as to be within the same geometric plane of the middle wall 33. The fourth plate piece 82 includes a pair of flaps 85 projecting gradually according to nearing to an end, at the upper side in the direction by arrow Y, of the fourth plate member 82 from the fourth plate member 82 along the widthwise direction of the groove 4 (direction by arrow X). The pair of flaps 85 extends along the widthwise direction of the groove 4 (direction by arrow X) so as to separate from each other. Thus, the fourth plate member 82 includes the flaps 85 projecting from the fourth plate member 82 along the widthwise direction (the direction by arrow X), so that length of the side cover 7, which the flaps 85 are provided, along the widthwise direction (direction by arrow X) is formed larger (longer) than that of the fourth plate member 82, which the flaps 85 are not provided. The fourth plate member 82 corresponds to "plate member" in claims.

The fifth plate member 83 is continued to the fourth plate member 82 at the upper side in the direction by arrow Y within the same geometric plane of the inner wall 34.

As shown in FIGS. 5 and 8, each one of the pair of first side plates 74 includes a first standing member 77; a deep-side parallel plate 78 continued to the first standing member 77 in parallel to the first-fifth plate members 87, 88, 81, 82, 83; a second standing member 79 (shown in FIG. 4) standing from the deep-side parallel plate 78 toward a deep side in parallel to the first standing member 77; a third standing member 76 standing from the deep-side parallel plate 78 toward the deep side at an inner side than the second standing plate 79; a pair of fourth standing members 71 standing from both edges of the fifth plate member 83 along the widthwise direction (direction by arrow X) to be overlapped on each vertical wall 35 of the main body 3; and a pair of lock members 72 engaged with each of later-described lock receiving members 94 of the second member 7B.

The pair of first standing members 77, as shown in FIG. 4, stands from the both ends of the first plate member 87 of the first plate 80 along the widthwise direction (direction by arrow X) toward the deep side so as to separate from each other. Each of the first standing members 77 corresponds to "connecting member" described in claims, to connect a later-described deep-side parallel plate 78 and the second plate member 88. When the insertion wall 36 penetrates between the later-described parallel plate 78 and the second plate member 88, each of the first standing members 77 is positioned corresponding to the insertion wall 36. The pair of first standing members 77 is arranged in parallel to the wall 43 and 45 from the first plate member 87 toward the third plate member 81 (along the direction by arrow Y)

As shown in FIGS. 3, 4, the insertion wall 36 penetrates between the deep-side parallel plate 78 and the second plate member 88. A top end of the deep-side parallel plate 78 penetrates between the above-mentioned walls 36 and the connecting wall 42. The deep-side parallel plate 78 and the second plate member 88 extend (project) along the widthwise direction of the groove 4 (direction by arrow X) in parallel to each other. The deep-side parallel plate 78 and the second plate member 88 are also arranged in parallel to the flaps 84 and 85 (third and fourth plate members 81, 82).

As shown in FIG. 6, the pair of third standing members 76 is arranged in parallel to the first and second standing members 77, 79. As shown in FIG. 6, when the second member 7B is assembled to the first member 7A, a later-described second side plate 92 of the second member 7B penetrates between the third standing members 76 and the second standing member 79. As shown in FIGS. 5, 6, each one of the pair of third standing members 76 includes an upper standing portion 76*a* and a lower standing portion 76*b* positioned under the upper standing portion 76*a*. The standing portions 76*a*, 76*b* are arranged at an interval to each other along the lengthwise direction (direction by arrow Y) and the second standing member 79 is positioned between the standing portions. The lock member 72 is provided on each surface of the pair of upper standing portions 76*a*, which surfaces are opposite to each.

As shown in FIG. 2, each of the pair of lock members 75 is provided between an end face, closer to the second plate member 88, of the first plate member 87 and the second plate member 88.

As shown in FIG. 2, the first wire passing section 73 is formed into a gutter shape extending straight along the lengthwise direction (direction by arrow Y).

As shown in FIG. 5, the second member 7B includes integrally a second penetration protect member 90 and a second wire passing section 93 continued to a bottom surface of the second penetration protect member 90.

As shown in FIGS. 5, 6, the second penetration protect member 90 is arranged corresponding to the first plate 80 of the first member 7A. The second penetration protect member 90 includes a second plate portion 91 overlapped on the bottom wall 4*a* of the groove 4; a pair of second side plates 92 overlapped respectively on each of the side walls 4*b* of the groove 4; and a pair of lock receiving members 94 provided respectively at each of the pair of second side plates 92, and locked respectively with each of lock members 72 of the first member 7A.

When the first member 7A is assembled with the second member 7B, the pair of second side plates 92 penetrates between the third standing members 76 and the second standing member 79 of the first member 7A. When each of the second side plates 92 penetrates between the third standing members 76 and the second standing member 79, the lock receiving member 94 is locked with the lock member 72 of the first member 7A.

The second wire passing section 93 is formed into a gutter shape. When the first member 7A is assembled with the second member 7B, the wire passing sections 73, 79 form a cylindrical shape. The electric wire, which is connected with electric components, is passed through the wire passing sections 73, 93. Fixing material such as adhesive tape is wound around the electric wires, which are connected with electric components, in the wire passing sections 73, 93 and filled in the wire passing sections 73, 93 so as to eliminate gaps therebetween.

Procedure of assembling the above electric connection box 1 will be described. Each of electric components, to which one end of electric wire is connected, is mounted at the cassette block 6, and the cassette block 6, which each of electric components is mounted, is received in the main body 3. Instead of that, after placing the cassette block 6, which each of electric components is mounted, in the main body 3, the end of the electric wire may be connected with each of the electric components. In the case, the cassette block 6 is received in the main body 3 so as to locate the electric components such a relay and fuse at the side of the upper surface 2*a* of the main body 3. The other end of the electric wire, which one end is connected to the electric component, is led from the side of upper surface 2*a* of main body 3, and arranged between the first member 7A and the second member 7B of the side cover 7. Thereafter, the first member 7A and second member 7B are closed to each other. Thereby, the lock member 72 of the first member 7A is locked with the lock receiving member 94, so that the first member 7A and the second member 7B are assembled to each other, and the side cover 7 is assembled. At the time, the electric wire which one end thereof is connected with each of the electric components and the other thereof is led out from the main body 3 (box main body 2), is passed through the side cover 7. Thereafter, the assembled main body 3 which the electric wire is passed through the side cover 7, is closed so as to make the second plate 91 of the second member 7B correspond to the bottom wall 4*a* of the groove 4, and each of the second side plates 92 is closed to each of the pair of side walls 4*b*. The side cover 7 is slid along the lengthwise direction of the groove 4 (direction by arrow Y). Thereby, the lock member 75 is locked with the lock receiving member 39 of the main body 3, and the side cover 7 is mounted at the main body 3 (box main body 2) so as to cover the groove 4. When the side cover 7 is mounted at the main body 3 (box main body 2), the base wall 32 and the third plate member 81 are arranged to be continued within the same geometric plane, and the middle wall 33 and the fourth plate member 82 are arranged to be continued within the same geometric plane. The insertion wall 36 arranged at the main body 3 penetrates between the deep-side parallel plate 78 and the second plate member 88 arranged at the side cover 7. The projections 37, 38 arranged at the main body 3 are positioned so as to correspond to the end face of the second plate member 88. Thereafter, in condition that the electric wire is passed through the side cover 7, the adhesive tape 8 as the fixing member is wound around the electric wire and filled in the wire passing sections 73, 93 so as to eliminate any gaps. Then, the lower cover 5 is mounted at the main boy 3 so as to cover the bottom face of the main body 3. Thereby, the box main body 2 is assembled and the side cover 7 is mounted at the box main body 2. Thus, the electric connection box 1 is completed.

According to the above embodiment, the electric connection box 1 includes the box main body 2 having the groove 4 recessed from the outer wall 31 so as to extend straight; and the side cover 7 slid along the lengthwise direction (direction by arrow Y) of the groove 4 so as to be mounted at the box main body 2 and coving the groove 4 when the side cover is mounted at the box main body 2. The side cover 7 is provided with the third and fourth plate members 81, 82 to be arranged within the same geometrical plane of the outer wall 31. Each of the first and fourth plate members 81, 82 is provided with the flap 84, 85 projecting from the third and fourth plate member 81, 82 along the widthwise direction (direction by arrow X) of the groove 4. Thereby, when the car is washed by high-pressured water, the flaps 84, 85 obstruct liquid such as water flowing up between the side cover 7 and the groove 4 along the lengthwise direction (direction by arrow Y). Thus, it is prevented that the water penetrates into the box main body 2. When the car is washed by high-pressure water, the electric connection box 1 can maintain waterproof.

The side cover 7 includes the deep-side parallel plate 78 and the second plate member 88 projecting along the widthwise direction (direction by arrow X) of the groove 4 and arranged at the interval to each other as the pair of parallel member, and the first standing member 77 as the connecting member connecting the pair of plate members 78, 88. The outer wall 31 is provided with the insertion wall 36 penetrating between the deep-side parallel plate 78 and the second plate member 88 and positioned so as to correspond to the first standing member 77. Thereby, when the car is washed by the high-pressure water, the pressured water firstly hits (swash) the insertion wall 36, and the energy of the water is decreased. The water, which energy is decreased, swashes the first standing member 77, and the energy of the water is further decreased. After that, the water hits the deep-side parallel plate 78 as the other parallel member arranged at inner side, and the energy of the water is further decreased. Thus, the energy of the water can be decreased (absorbed), so that it can be prevented that the water penetrates into the box main body 2. Therefore, waterproof can be more improved.

The box main body 2 includes projections 37, 38 projecting from the insertion wall 36 toward outside of the box main body 2. The projections 37, 38 are arranged to correspond to the end face of the second plate member 88 as the one parallel member of the deep-side parallel plate 78 and the second plate member 88 positioned outer side more than the other one. Thereby, the projections 37, 38 cover the gap between the insertion wall 36 and the second plate member 88, and it can be prevented that the water penetrates into the box main body 2. Therefore, waterproof can be more improved.

According to the above embodiment, the plurality of flaps 84, 85. The present invention is limited on this case, one of the plurality of flaps 84, 85 may be provided.

According to the above embodiment, the plurality of projections 37, 38. The present invention is limited on this case, one of the plurality of projections 37, 38 may be provided.

The present inventions are described based in the embodiments as mentioned above, but the present invention is not limited in above embodiments. Various change and modifications can be made with the scope of the present invention.

Remarks
1 Electric connection box
2 Box main body
7 Side cover
31 Outer wall
36 Insertion wall
37 First projection (projecting portion)
38 Second projection (projecting portion)
77 First standing member (connecting member)
78 Deep-side parallel member (Other of parallel member)
81 Third plate member (plate member)
82 Fourth plate member (plate member)
84, 85 Flap
88 Second plate member (one of parallel member)
Direction by arrow Y Lengthwise direction
Direction by arrow X Widthwise direction

The invention claimed is:

1. An electric connection box, comprising:
   a box main body having a groove recessed in an inward direction of the box main body from an outer wall of the box main body, the groove extending straight; and
   a side cover having a first member and a second member slid along a lengthwise direction of the groove so as to be mounted at the box main body, and covering the groove when the side cover is mounted at the box main body,
   wherein the first member and the second member have an electric wire pass therebetween, one end of the electric wire being connected to an electric component mounted to the electric connection box, the other end being led out from the box main body,
   wherein the side cover is provided with a plate member to be formed so as to be arranged within a same geometrical plane of the outer wall,
   wherein an upper portion of the plate member is flap-shaped with a pair of opposing flaps extending in a widthwise direction of the groove parallel to the outer wall of the box main body to prevent outside water from penetrating into the box main body, the flap-shaped upper portion including a gradual widening of the upper portion of the plate member from lower portions of the opposing flaps to upper portions of the opposing flaps, and
   wherein the side cover comprises:
      a pair of parallel members, each member projecting along the widthwise direction of the groove so as to be arranged at an interval to each other in the inward direction of the box main body; and
      a connecting member connecting the pair of parallel members;
      wherein the outer wall is provided with an insertion wall straightly penetrating between the pair of parallel members so that an edge face of the insertion wall is positioned at a position corresponding to the connecting member.

2. The electric connection box according to claim 1, wherein the insertion wall comprises a projection projecting from the insertion wall toward an outside of the box main body, wherein a side face of the projection is arranged to correspond to an end face of one of the parallel members wherein one of the parallel members is located at an outer side more than a remaining of the parallel members.

* * * * *